United States Patent
Stevens (10) Patent No.: US 6,173,345 B1
(45) Date of Patent: Jan. 9, 2001

(54) METHOD AND APPARATUS FOR LEVELIZING TRANSFER DELAYS FOR A CHANNEL OF DEVICES SUCH AS MEMORY DEVICES IN A MEMORY SUBSYSTEM

(75) Inventor: William A. Stevens, Folsom, CA (US)

(73) Assignee: Intel Corporation, Santa Clara, CA (US)

( * ) Notice: Under 35 U.S.C. 154(b), the term of this patent shall be extended for 0 days.

(21) Appl. No.: 09/186,042

(22) Filed: Nov. 3, 1998

(51) Int. Cl.[7] .............................. G06F 13/00; G06F 12/00
(52) U.S. Cl. ............................................. 710/100; 711/167
(58) Field of Search .................................. 710/100, 58, 1, 710/61, 74; 711/167, 100, 148; 709/213; 365/194; 340/825; 370/465; 714/702, 724; 702/108, 117

(56) References Cited

U.S. PATENT DOCUMENTS 3,629,860 * 12/1971 Capozzi .
4,263,651 * 4/1981 Donath et al. .
5,081,575 * 1/1992 Hiller et al. .
5,502,672 * 3/1996 Kwon .
5,561,825 * 10/1996 Yamagami et al. .

OTHER PUBLICATIONS

Rambus Advance Information—Direct RAC Data Sheet dated Aug. 7, 1998.
Rambus Advance Information—Direct Rambus RIMM Module 128 MBytes (64Mx16/18) dated Aug. 20, 1998.
Rambus Advance Information—Direct RMC.d1 Data Sheet dated Aug. 7, 1998.
Rambus Advance Information—Direct RDRAM 64/72–Mbit (256Kx16/18x16d) Datasheet.
Rambus Advance Information—RIMM Serial Presence Detect Application Note dated Oct. 9, 1997.

* cited by examiner

Primary Examiner—Gopal C. Ray
(74) Attorney, Agent, or Firm—Jeffrey S. Draeger (57) ABSTRACT

A method and apparatus for levelizing transfer delays for a channel of devices. One method described determines a controller delay value by iteratively testing memory transfers to determine a largest transfer latency value using a subset of all available delays for at least one of a plurality of memory devices. Additionally, a memory device delay value for each of the plurality of memory devices is determined by testing memory transfers using at least one delay value for each of the plurality of memory devices.

51 Claims, 4 Drawing Sheets

METHOD AND APPARATUS FOR LEVELIZING TRANSFER DELAYS FOR A CHANNEL OF DEVICES SUCH AS MEMORY DEVICES IN A MEMORY SUBSYSTEM

RELATED APPLICATIONS

This application is related to an application Ser. No. 09/186,051, entitled "A Method And Apparatus For Configuring And Initializing A Memory Device And A Memory Channel," application Ser. No. 09/186,050, entitled "A Method And Apparatus For Configuring A Memory Device And A Memory Channel Using Configuration Space Registers," and application Ser. No. 09/186,049, entitled "A Method And Apparatus For Restoring A Memory Device Channel When Exiting A Low Power State," all of which are filed concurrently herewith.

BACKGROUND

1. Field of the Invention

The present disclosure pertains to the field of data processing systems. More particularly, the present disclosure pertains to levelizing transfer delays for multiple data transfer devices such as memory devices configured in a memory channel.

2. Description of Related Art

In some data transfer systems, data transfer delays between a set of system devices and a bus controller may need to be levelized, meaning that the data transfer delay is adjusted so that the sum of the data transfer delay and the propagation delay is equal to the same number of bus cycles for all devices on the bus. With levelized delays, the bus controller can respond to the entire set of system devices in a uniform manner. Such levelization is typically performed at system start-up or during another initialization period when data transfer to the set of devices is otherwise suspended. An efficient technique for levelizing delays may advantageously reduce the length of the initialization period, thereby allowing faster resumption or commencement of system processing activities.

Many prior art memory subsystems require an entire set of memory devices to respond during a single bus cycle. Although the response time may be programmed to a different value or extended by inserting wait states, all data is expected to arrive at the memory controller within the same clock cycle. A system in which all devices respond during the same clock cycle may not require delay levelization; however, such designs may require expensive printed circuit boards and may be limited in achievable bandwidth.

On the other hand, some systems include devices which are positioned along a relatively lengthy bus or "channel" such that the system does not attempt to complete data transmission along the bus during a single bus clock cycle. In fact, the clock rate for the bus may be high enough that devices on one end of the bus distant from the bus controller may have a several bus clock cycle propagation delay to the bus controller. Compounding the propagation delay problem, various devices along the channel may have different transaction response times.

A Rambus (TM) Direct Rambus Dynamic Random Access Memory (Direct RDRAM) bus is one example of a bus which utilizes memory devices along a channel. It is known that a Direct RDRAM Memory Controller (RMC) may expect to receive data from all devices along a channel during a particular bus cycle. In fact, a controller, described in "Direct RMC.d1 Data Sheet" available from Rambus Corporation of Mountain View, Calif., provides a controller delay register to assist in levelizing delays.

Additionally, one or more delay registers may also be provided within individual RDRAM devices (e.g., a $T_{RDLY}$ register discussed in the Rambus "Direct RDRAM 64/72-Mbit" Data Sheet at p. 36). Values may be stored in these registers in order to equalize delays between the various devices along the channel. Typically, the controller delay value is initialized first, then the delay values for individual memory devices are adjusted.

The prior art may not provide a mechanism to reduce the number of cycles performed during initialization. In general, the prior art may not specify particular ways to test only a subset of the total number of possible delay values. The prior art also may not specify a method of choosing initial values for certain delay testing iterations, an efficient order for testing delay values, a method for performing each test, or a way of aborting delay testing and disabling devices when certain values are reached. Thus, the prior art may not provide an adequate method for levelizing delays along a channel of devices.

SUMMARY

A method and apparatus for levelizing transfer delays for a channel of devices is disclosed. One method disclosed determines a controller delay value by iteratively testing memory transfers to determine a largest transfer latency value using a subset of all available delays for at least one of a plurality of memory devices. Additionally, a memory device delay value for each of the plurality of memory devices is determined by testing memory transfers using at least one delay value for each of the plurality of memory devices.

BRIEF DESCRIPTION OF THE FIGURES

The present invention is illustrated by way of example and not limitation in the figures of the accompanying drawings.

DETAILED DESCRIPTION

The following description provides a method and apparatus for levelizing transfer delays for a channel of devices such as memory devices in a memory subsystem. In the following description, numerous specific details such as register names, memory types, bus protocols, specific types of components, logic partitioning and integration choices are set forth in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement the necessary logic circuits without undue experimentation.

The disclosed techniques may provide an efficient initialization process for levelizing delays between a controller and a set of devices. The initialization process may be efficient because only a subset of the total number of possible delay values need to be tested. For example, exhaustive delay testing may be avoided by using an efficient order for testing delay values, by choosing particular initial values for certain delay testing iterations, and/or by aborting delay testing when certain values are reached. As a result of utilizing the disclosed techniques, other processing may commence or restart more rapidly, thereby allowing increased system throughput.

Efficient initialization of a memory subsystem may be particularly difficult due to a lack of storage for variables during initialization. Since the memory itself is being initialized, it may not be available for storage of temporary values. Additionally, the basic input/output system (BIOS) program which typically performs the initiation usually has little or no memory in which to temporarily store values. Thus, an initialization routine may have limited resources available to support an optimal initialization flow.

Some embodiments of the disclosed two phase technique may avoid the need for large amounts of storage by first testing for a maximum latency to set a controller delay value and then cycling through each memory device to set a device delay value. Efficiency may be maintained by intelligently cutting out unnecessary iterations in both phases of the process.

Figure 1:
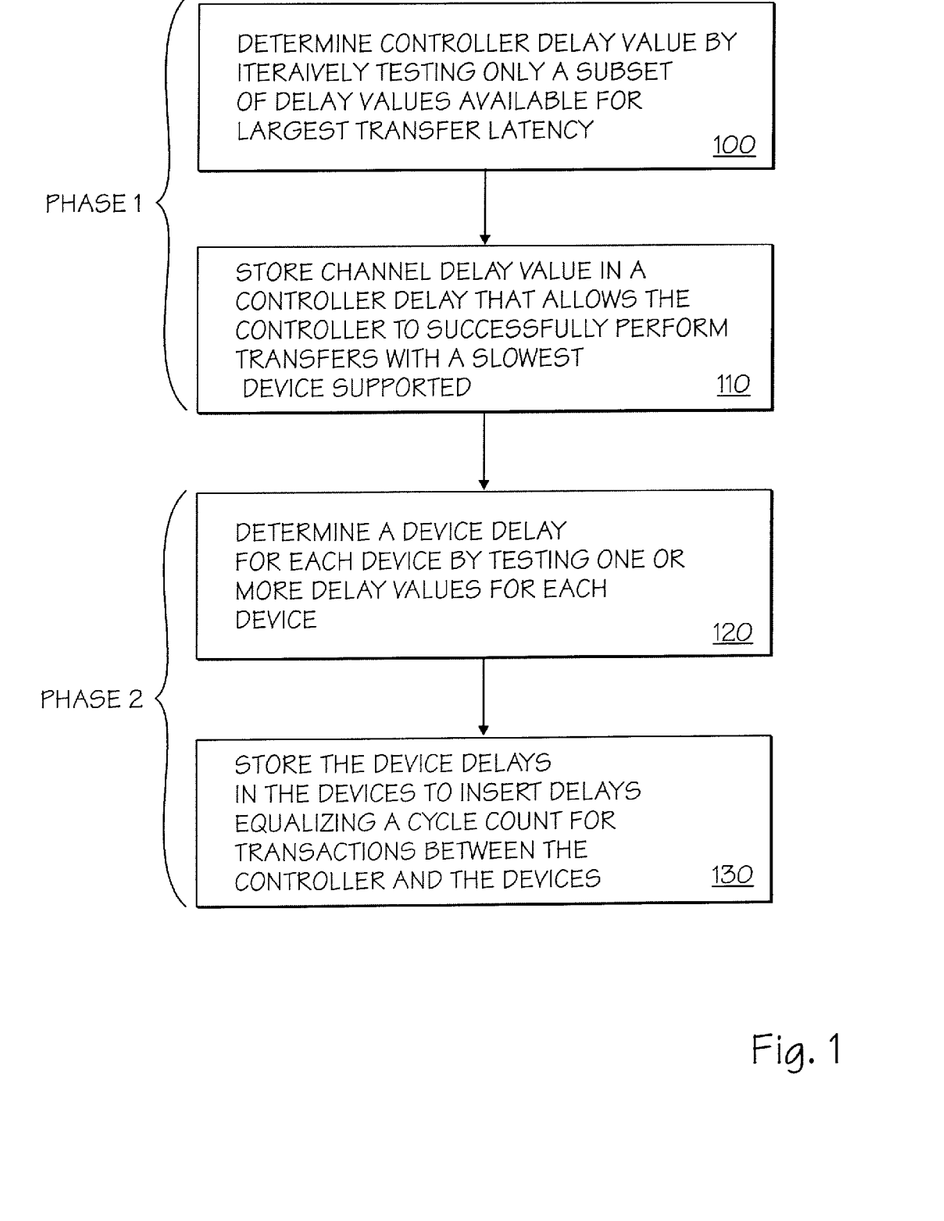
FIG. 1 illustrates a flow diagram of one embodiment of a system that levelizes delays for memory devices.

FIG. 1 illustrates a generalized flow diagram for delay levelization for a set or a channel of devices which exchange data with a controller over a bus. Phase 1 of this technique involves programming a controller delay value based on a maximum device latency. The controller delay value determined in phase 1 is a function of the largest transfer latency value of the devices on the bus. Depending on the particular transfer initiation and/or data receipt hardware employed, the controller delay value may either be equal to or derived from the largest transfer latency value.

One possible technique of finding the controller delay determined by iterative testing. As indicated in block 100, however, a controller delay value may be determined by testing only a subset of delay values available. In other words, a controller may have N possible internal delay values which can be used to compensate for delays of the various devices along a bus, and less than N tests will be run on at least some of the memory devices under certain conditions. This testing of a subset of delay values may be accomplished, for example, by aborting a phase of the testing when a certain maximum controller delay value is found or by starting new iterations at the final value determined for a previous device.

In block 110, the controller delay value is stored in the controller to allow the controller to successfully perform transfers with a slowest device on the bus. In one embodiment, the controller inserts the determined number of delays into a clock path of a sampling circuit (e.g., a latch) which receives data from the device. The delayed clock to the sampling circuit compensates for the propagation delay from the device to the controller, allowing the controller to successfully latch in data driven by the device.

Since the controller delay value is based on the largest latency value, the controller may only be capable of successfully receiving data from devices which are within the same time domain (i.e., devices whose data arrives at the controller within the same clock cycle) at the end of phase 1. Thus, at the end of phase 1 (after blocks 100 and 110), further configuration may be appropriate to allow the controller to receive data from all of the devices.

In phase 2, all enabled devices on the bus are configured to return data to the controller within the same cycle. As indicated in block 120, a delay value for each device is determined by testing one or more delay values for each device. Devices close to the controller may need to insert several delay cycles to obtain proper data arrival times, whereas devices at the far end of the bus may need one or zero additional delay cycles. Moreover, the device with the largest acceptable latency (determined in phase 1) should not need any additional delay cycles since the delay in the controller is matched to that device.

Figure 2:
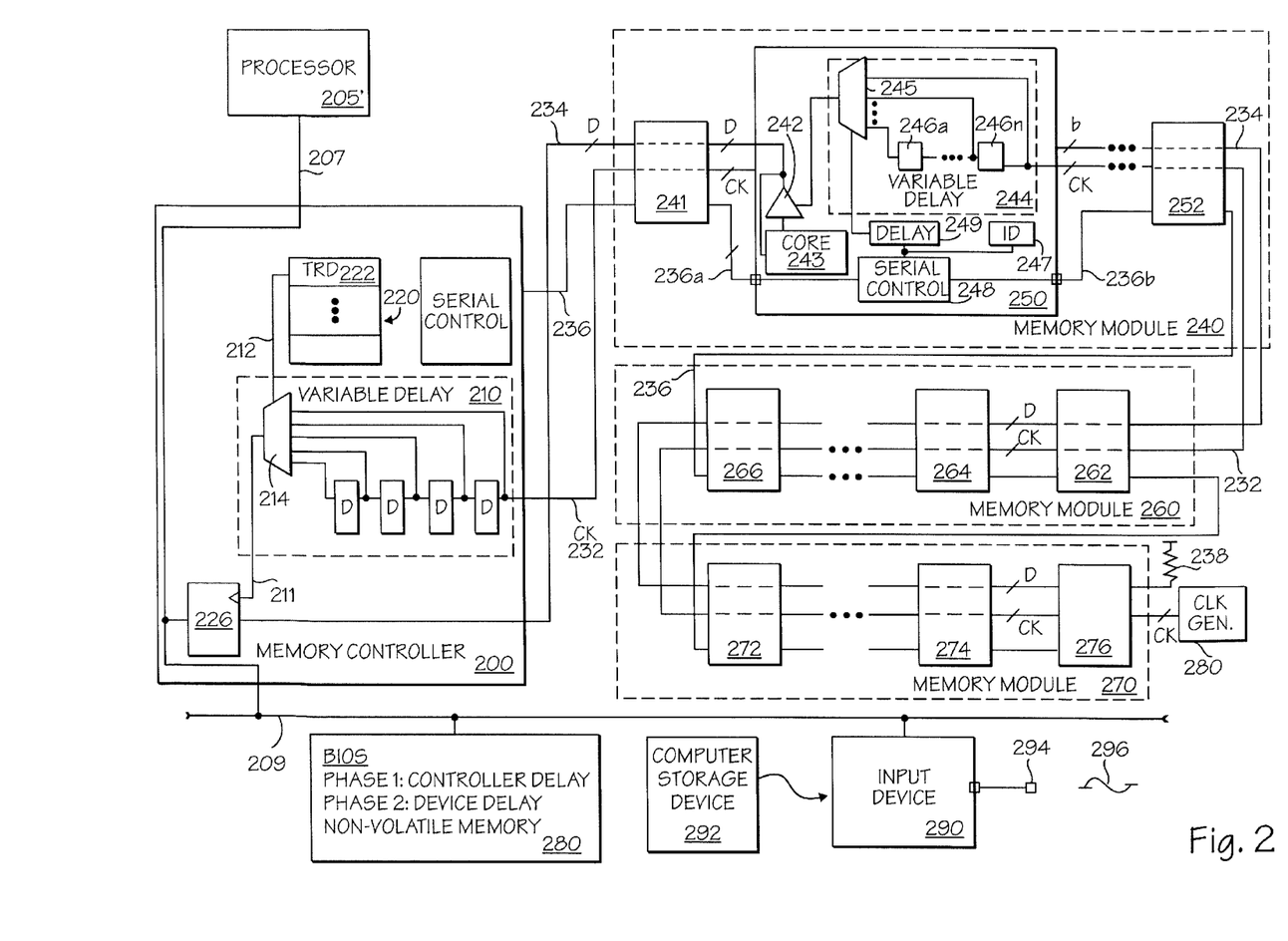
FIG. 2 illustrates one embodiment of a system that levelizes delays for memory devices.

FIG. 2 illustrates one system utilizing a delay levelization technique in the context of a memory controller and a series of memory devices placed along a memory bus or memory channel. In one embodiment, the channel may be a Rambus Direct RDRAM channel. Alternative embodiments may utilize other bus architectures or arrangements which, without such levelization, would return data during different bus cycles (or in different time domains) depending on the propagation delay caused by the physical placement of the memory devices.

The system in FIG. 2 includes a processor 205 coupled to a memory controller 200 by a bus 207. The memory controller 200 includes a controller read delay register field (TDR) 222, a variable delay circuit 210, and a latch 226 to allow capturing of read data from memory devices that may be located at varying distances (and hence varying propagation delays) from the memory controller 200. The controller register 222 may be one of a set of control registers 220 such as peripheral component interconnect (PCI) configuration space registers that may be written to by the basic input/output system (BIOS).

The illustrated embodiment of the variable delay circuit 210 includes a multiplexer 214 controlled by the controller delay register 222. Four delay elements 216, 217, 218, and 219, which each delay latching of the latch 226 by one bus clock, provide four inputs to the multiplexer 214. The multiplexer 214 provides a clock signal to the latch 226 by selecting one of four delays based on the value in the controller delay register 222. In other embodiments, other numbers of delay elements may be used, allowing a larger or smaller number for the maximum controller delay, which in this case is four. Additionally, any type of known or otherwise available variable delay circuit may be used.

The memory controller 200 also includes serial control logic 224. The serial controller logic may implement a serial presence detect (SPD) transfer protocol described in the "RIMM™ Serial Presence Detect Application Note" available from Rambus. In alternative embodiments, the serial control logic 224 may be replaced with control logic implementing another protocol, serial or otherwise, which allows the programming of registers such as delay and identification registers in the various devices with which the memory controller 200 communicates.

The memory controller 200 is coupled by a serial bus 236, a clock bus 232 (CK), and a data bus 234 (D) to three memory modules. Each memory module may contain a varying number of memory devices. A first memory module 240 illustrates a first memory device 241, a second memory device 250, and a last memory device 252. Several internal features of the memory device 250 are shown and will be discussed below.

The serial bus 236 is a segmented bus which passes through each device. A second segment 236a of the serial bus 236 extends from the memory device 241 to the memory device 250. Likewise, a third portion 236b extends from the memory device 250 to a next memory device (not shown). The clock bus 232 and the data bus 234, on the other hand, pass continuously all through the channel as indicated by the dotted lines through, for example, memory devices 241 and 252.

A second memory module 260 and a third memory module 270 are similarly configured. The second memory module 260 includes a first memory device 262, a second memory device 264, and a last memory device 266. The third memory module 270 includes a first memory device 272, a second last memory device 274, and a last memory device 276. The clock bus 232 and the data bus 234 pass through the second and third memory modules and connect to each memory device. The serial bus continues in segmented fashion between each device.

After the end of the third memory module 270, the data and clock buses end. The data bus is terminated in a termination impedance 238 to reduce signal reflections. A clock generator 280 is coupled to the end of the clock bus 232. In one embodiment, the clock bus includes four signal lines for bus clocks. In this embodiment, a first clock generator (not shown) delivers a "clock from master" (CFM) clock and its complement on two lines from the memory controller end of the clock bus 232, and the clock generator 280 delivers a "clock to master" (CTM) clock and its complement on two additional signal lines from the opposite end of the clock bus 232.

The memory device 250 illustrates a variety of components which may also be included in the other illustrated memory devices. Data may be written to or received from the data bus 234 by a core 243 which contains individual memory cells and associated control logic. A driver circuit 242 is coupled to the core 243 to drive data from the core 243 to the data bus 234. The driver 242 is enabled or strobed by an output from the variable delay circuit 244 which is in turn controlled by a delay register 249. The delay register 249 is coupled to serial control logic 248 and therefore may be programmed with device delay values determined by the BIOS and transmitted by the memory controller 200 via the serial control logic 224 and serial bus 236.

Additionally, one or more identification register (ID) 247 may contain two IDs, a group device ID and a serial device ID. The group device ID (also referred to as the "device ID") addresses a particular memory device when performing data or command transactions using the data bus 234 and/or other control lines (not shown). The serial device ID may be used to identify particular devices when using the serial bus 236. The serial device ID and the device ID often are not the same because device IDs may be selected to optimize performance whereas serial IDs may be determined strictly based on physical positioning of the memory devices.

The variable delay circuit 244 includes a set of delay blocks 246a–246n which may vary in number from device to device or module to module. Typically, a non-volatile memory accessible via the serial bus 236 contains information indicating the maximum number of delays available for each memory device of a memory module. A multiplexer 245 selects a clock signal from the clock bus 232 which is delayed a number of bus clock cycles that is determined by the value stored in the delay register 249. Consequently, a memory device can insert delay cycles as needed to assure data reaches the memory controller 200 during a particular bus clock cycle. For memory devices such as device 276 which is at the end of the bus, the delay value may be zero.

For devices such as device 241, which is close to the memory controller 200, as many bus cycles as are necessary for data to propagate from device 276 to device 241 may be inserted to levelize the delays of those two memory devices.

The system of FIG. 2 also includes a bus 209 that is coupled to the memory controller 200. The bus 209 may be a bus which is directly coupled to the bus controller 200 or one which is indirectly coupled to the memory controller 200 by one or more bridge circuits. A non-volatile memory 280 (e.g., a flash memory) containing BIOS code and an input device 290 are coupled to the bus 209. Alternatively, these devices may be coupled to separate buses or otherwise configured so they are accessible to the system.

The input device 290 may either accept program instructions from a computer storage device 292 (e.g., an optical or magnetic disk or other storage device) or from a network or communications interface 294. BIOS code (i.e., computer instructions) causing the system to implement the disclosed techniques may be programmed into the non-volatile memory 280 in several ways. The BIOS may be programmed when the system is manufactured or may be later delivered via a computer readable medium through the input device 290.

In cases where the BIOS is later delivered, the instructions may be delivered via a computer readable medium. With an appropriate interface device 290, either an electronic signal or a tangible carrier is a computer readable medium. For example, the computer storage device 292 is a computer readable medium in one embodiment. A carrier wave 296 carrying the computer instruction is a computer readable medium in another embodiment. The carrier wave 296 may be modulated or otherwise manipulated to contain instructions that can be decoded by the input device 290 using known or otherwise available communication techniques. In either case, the computer instructions may be delivered via a computer readable medium.

Figure 3:
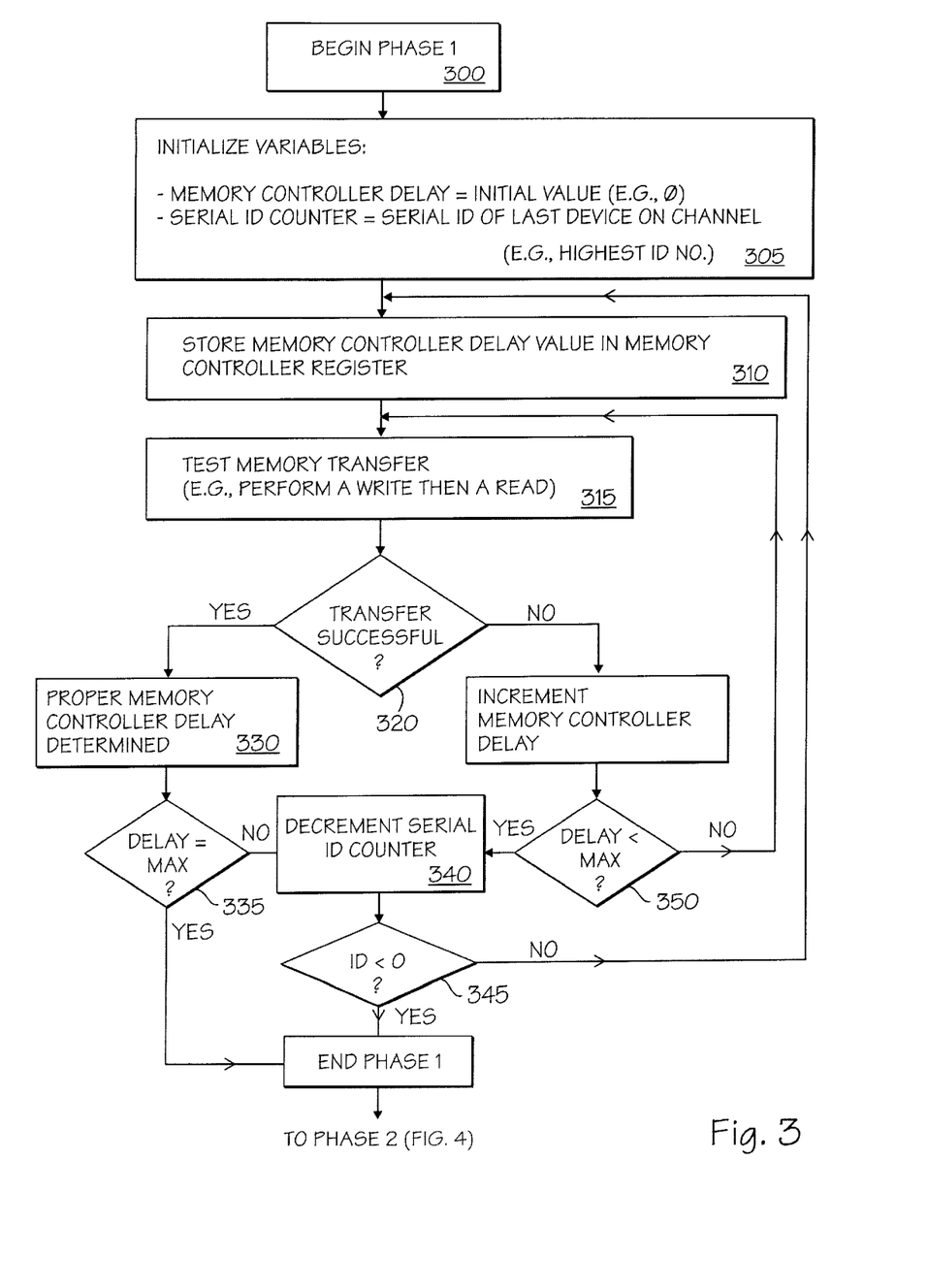
FIG. 3 illustrates one embodiment of a first phase of delay levelization in which a controller delay value is determined.
Figure 4:
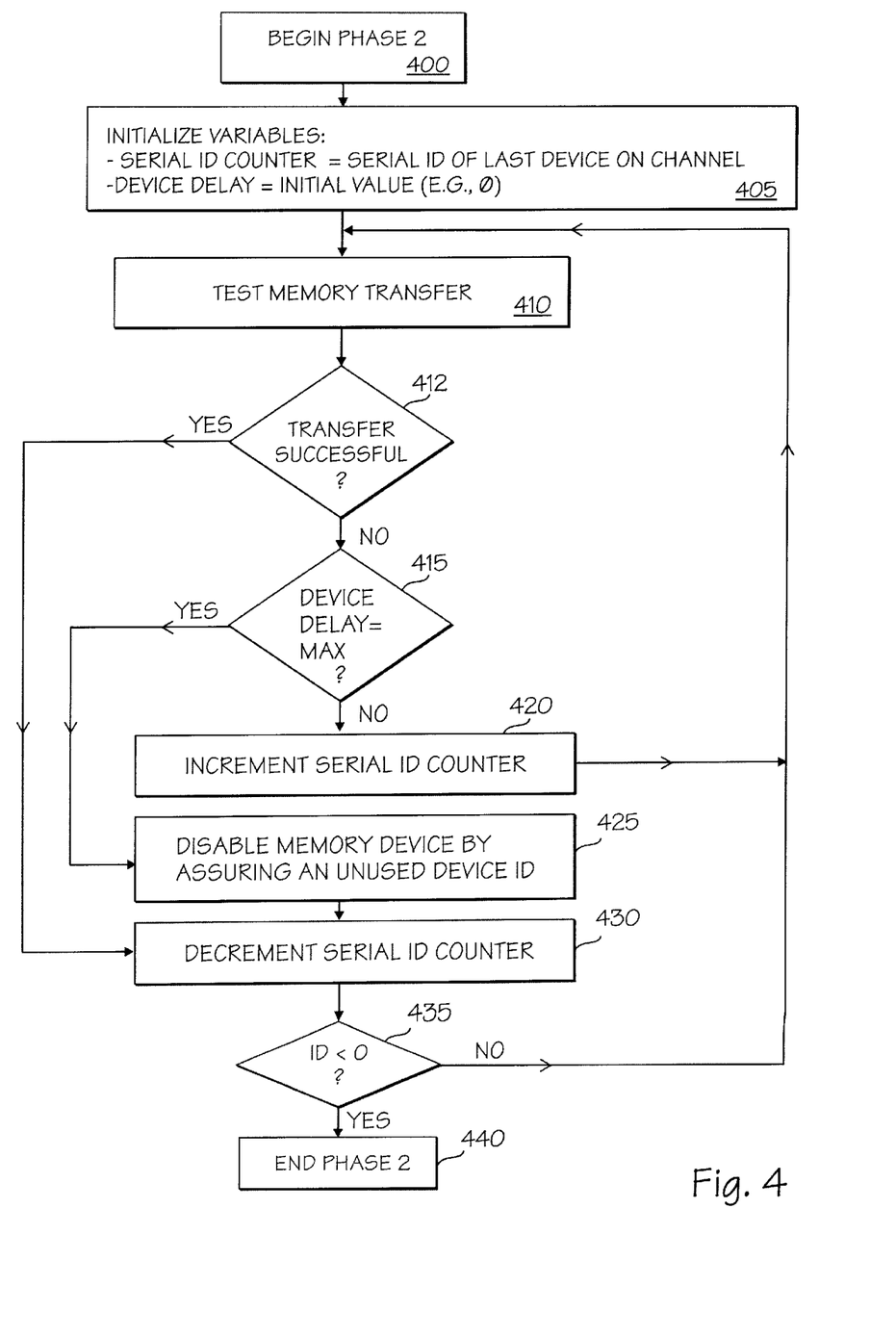
FIG. 4 illustrates one embodiment of a second phase of delay levelization in which individual device delays are determined for each enabled device.

Operation of one embodiment of the system of FIG. 2 is illustrated in the flow diagrams of FIGS. 3 and 4 which respectively illustrate phase 1 and phase 2 operations. In block 300 of FIG. 3, phase 1 begins. In block 305, some variables are initialized. The memory controller delay value is initialized to an initial value that represents the number of delay cycles first tested by the memory controller in determining the final controller delay value. In one embodiment, zero is chosen as the initial value to ensure that the controller delay value is no greater than necessary.

Additionally, the serial ID counter is initialized to indicate the last device in the serial chain of the channel in block 305. In one embodiment, the serial Ids are assigned so that the last device in the serial chain has the highest serial ID number. The highest serial ID, however, may not have the longest trace distance to the controller. The serial bus 236 may progress in a fixed direction (e.g., left to right as shown in FIG. 21) on each memory module while the data bus 234 traverses different modules in different directions. Thus, it may be advantageous to start with the highest serial ID number because, although the highest serial ID number may not indicate the very furthest memory device from the controller, it is likely to at least be on the furthest memory module.

Next, as indicated in block 310, the controller delay value is stored in the memory controller register 222. After the controller delay is stored in the controller register 222, a test transfer is perform as indicated in block 315. For example, in one embodiment, a particular memory location in the memory device being tested may be written to and then read back. The success of this transfer is tested in block 320. If the data value read back does not match the data written, then the transfer was not successful. Thus, if the data read back is earlier than expected by the memory controller, it is not properly captured and the transfer is not successful.

If the transfer is not successful, the memory controller delay is incremented as indicated in block 325 to give the data more time to reach the memory controller. Whether the memory controller delay exceeds a maximum delay value supported by the controller (e.g., in the embodiment of FIG. 2, four), as tested in block 350. If so, the controller is unable to insert enough delays to read the data from the device, and no further tests are performed on that device as the serial ID is decremented in block 340. In one embodiment, the maximum delay value is four.

If, on the other hand, the delay is less than the maximum delay value supported by the memory controller, the memory controller 200 may delay the clock signal from the variable delay 210 by another cycle and again try to capture the data. Thus, the process returns to block 315 if the controller delay is not greater than the maximum delay supported by the controller as tested in block 350.

Once a successful transfer is detected in block 320, the proper controller delay has been determined for that particular memory device as indicated in block 330. If the delay is the maximum delay supported by the controller, as tested in block 335, phase one is completed as indicated in block 355. Phase 1 is completed because the controller must utilize its maximum delay value for this memory device and there is accordingly no further need to test other memory devices. Thus, exhaustive controller delay testing may be aborted to save initialization time.

If the controller delay value is not the maximum delay value, then other memory devices are checked to determine their delay values. As indicated in block 340, the serial ID counter is decremented to select a next memory device. In block 345, it is determined whether there are any more memory devices to be tested. If not, phase one ends as indicated in block 355. In the embodiment where the highest ID number is first selected and subsequent devices are selected by decrementing the ID number, the determination of whether there are any more memory devices to be tested may be made by testing whether the ID number is less than zero. Alternative tests may be used for different ID numbering and/or test sequencing.

If there are any more memory devices to be tested, the process returns to block 310. The controller delay value determined to be sufficient for the prior memory device is the starting point for the next iteration. Even if the new memory device returns data more quickly, the memory controller is nonetheless limited by the slower previous device and may not be able to decrease the controller delay value. Therefore, by starting with the previously determined controller delay value, the number of testing cycles may be reduced and the initialization process shortened.

Furthermore, since phase one may first test a device in the physically most distant memory module, the largest delays are likely to appear in the first set of memory devices. Accordingly, closer devices may be able to transfer data back to the controller on the first test transfer. Thus, by selecting the highest serial ID number as a starting point in block 305, a number of tests for low-propagation-delay devices may be skipped.

Phase 2 begins in block 400 of FIG. 4. Again variables are initialized as indicated in step 405. The serial ID counter is initialized to the serial ID of the last device on the channel, making the last device the selected device to be tested. The device delay for the selected device is set to an initial value. In one embodiment, zero may be used as an initial value since some devices may operate properly with no additional delay.

As indicated in block 410, a memory transfer is conducted to test the selected memory device. If the transfer attempted in block 410 is not successful, as tested in block 412, the tested device delay value is compared to a maximum device delay value as indicated in block 415. If the tested device delay value is the maximum delay value, then the device has failed to accurately transmit data to the memory controller despite adding the maximum delay to its data output. In this case, the memory device is disabled, as indicated in block 425. The device may be disabled by assigning a device ID which is not used by the memory controller so that data transfers between the disabled device and the controller do not occur. Thereafter, other devices may be tested as the serial ID counter is advanced and the process continues with block 425.

On the other hand, if the transfer attempted in block 410 is successful, as tested in block 412, the device delay presently programmed in the selected device is sufficient to accurately transfer data to the memory controller, and other devices may be tested. Accordingly, the serial ID counter is decremented, as indicated in block 430.

Whether any devices remain to be tested is then determined. As indicated in block 435, this may be accomplished in one embodiment by testing whether the serial ID counter is less than zero. If devices remain to be tested, the next device now indicated by the decremented serial ID counter is the next device tested as the process returns to block 410. If no devices remain untested, phase 2 is complete as indicated in block 440. At this point, all devices are either disabled or have a proper device delay value programmed so that each device in the channel, in response to a particular cycle, returns data to the controller after the same number of bus cycles.

Thus, a method and apparatus for levelizing transfer delays for a channel of devices such as memory devices in a memory subsystem is disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A method comprising:
   determining a controller delay value by iteratively testing memory transfers to determine a largest transfer latency value using a subset of a plurality of memory controller delays for at least one of a plurality of memory devices; and
   determining a memory device delay value for each of the plurality of memory devices by testing memory transfers using at least one delay value for each of the plurality of memory devices.

2. The method of claim 1 further comprising:
   storing the controller delay value in a controller storage location in a controller to set a channel delay that allows the controller to perform transactions with a slowest of the plurality of memory devices; and
   storing each memory device delay value in one or more delay storage locations of each of the plurality of memory devices to insert a delay levelizing a cycle count for data transactions between the controller and the plurality of memory devices.

3. The method of claim 1 wherein determining the memory device delay value further comprises:
if less than a maximum number of device delay cycles causes the data transfer to succeed, then:
determining a number of delay cycles that causes the data transfer to succeed; and
if more than the maximum number of device delay cycles are required to cause the data transfer to succeed, then:
stopping when the maximum number of device delay cycles is exceeded.

4. The method of claim 1 wherein determining the controller delay value comprises:
determining a first delay value for a first memory device by iteratively increasing the first delay value from an initial delay value, the first delay value being a number of cycles delay until data is received by a controller from the selected memory device;
determining a next delay value for a next memory device starting at the first delay value; and
selecting the greater of the first delay value and the next delay value as the controller delay value.

5. The method of claim 4 further comprising:
repeating determining the next delay value for another next memory device selected from the plurality of memory devices; and
selecting a greater of the controller delay value and the next delay value as the controller delay value.

6. The method of claim 5 wherein the first memory device has a last serial identification value of the plurality of memory devices and where the method further comprises:
selecting the next memory device by selecting a memory device with a serial identification value prior to the selected memory device.

7. The method of claim 1 wherein determining the controller delay value comprises:
initializing a controller delay value to an initial delay value;
testing whether a transaction to a selected memory device succeeds;
if the transaction to the selected memory device fails then incrementing the controller delay value; and
returning to testing whether the transaction to the selected memory device succeeds.

8. The method of claim 7 further comprising:
if the transaction to the memory device succeeds, then returning to testing whether the transaction to the selected memory device succeeds using the controller delay value for the transaction to the memory device which succeeded after selecting a new memory device from the plurality of memory devices as the selected memory device.

9. The method of claim 7 further comprising:
if the transaction to the memory device succeeds, then testing whether the controller delay value is a maximum controller delay value;
if the controller delay value is less than the maximum controller delay value then returning to testing whether the transaction to the selected memory device succeeds after selecting a new memory device as the selected memory device;
if the controller delay value is the maximum controller delay value then:
storing the maximum controller delay value as the controller delay value; and
stopping iterative testing to determine the controller delay value.

10. The method of claim 1 wherein determining the controller delay value further comprises:
if the controller delay value is less than a maximum controller delay value, then
selecting a new memory device as the selected memory device unless the controller delay value has been tested for all of the plurality of memory devices.

11. The method of claim 1 further comprising:
programming the memory device delay value for each of a plurality of enabled memory devices into a control field for the respective memory device to levelize delays from each of the plurality of memory devices to a controller.

12. The method of claim 11 wherein programming the plurality of memory device delay values in the plurality of memory devices further comprises:
testing whether a device delay value for a memory device is less than a maximum device delay value; and
if the device delay value is greater than the maximum device delay value then disabling the memory device;
if the controller delay value is less than the maximum controller delay value, then selecting a new memory device as the selected memory device unless the controller delay value has been tested for all of the plurality of memory devices.

13. The method of claim 12 wherein disabling the memory device comprises disabling a serial identification value of the memory device.

14. A method comprising:
determining a first delay value for a first memory device by iteratively increasing the first delay value from an initial delay value, the first delay value being a number of cycles delay until data is received by a controller from the selected memory device;
determining a next delay value for a next memory device starting at the first delay value;
selecting the greater of the first delay value and the next delay value as the controller delay value;
testing whether the controller delay value is a maximum controller delay value; and
if the controller delay value is the maximum controller delay value then:
storing the maximum controller delay value as the controller delay value in a register of the controller; and
stopping iterative testing to determine the controller delay value.

15. The method of claim 14 further comprising:
if the controller delay value is less than the maximum controller delay value then returning to testing whether the transaction to the selected memory device succeeds after selecting a new memory device as the selected memory device.

16. A method comprising:
determining an individual memory delay value for each of a plurality of memory devices, the individual memory delay value being a number of delays up to a maximum delay value which levelizes a read delay for the plurality of memory devices; and
testing whether a device delay value for a memory device is less than a maximum device delay value;

if the device delay value is greater than the maximum device delay value then disabling the memory device by assigning an unused device identification number;

if the device delay value is less than the maximum device delay value then testing whether another device delay value for another memory device is less than the maximum device delay value.

17. A system comprising:

a processor;

a memory controller coupled to the processor;

a plurality of memory devices coupled to the memory controller; and a separate memory device having stored thereon a plurality of instructions which, if executed by the system, cause the system to perform a set of operations comprising:

determining a controller delay value by iteratively testing memory transfers to determine a largest transfer latency value using a subset of a plurality of memory controller delays for at least one of a plurality of memory devices; and determining a memory device delay value for each of the plurality of memory devices by testing memory transfers using at least one delay value for each of the plurality of memory devices.

18. The system of claim 17 wherein the separate memory device is a non-volatile re-programmable memory device and wherein the plurality of instructions are part of a basic input/output system (BIOS) program.

19. The system of claim 17 wherein the set of operations further comprises:

storing the controller delay value in a controller storage location in the memory controller to set a channel delay that allows the memory controller to perform transactions with a slowest of the plurality of memory devices; and storing each memory device delay value in one or more delay storage locations of each of the plurality of memory devices to insert a delay levelizing a cycle count for data transactions between the memory controller and the plurality of memory devices.

20. The system of claim 17 wherein determining the memory device delay value further comprises:

if less than a maximum number of device delay cycles causes the data transfer to succeed, then:
determining a number of delay cycles that causes the data transfer to succeed; and if more than the maximum number of device delay cycles are required to cause the data transfer to succeed, then:
stopping when the maximum number of device delay cycles is exceeded.

21. The system of claim 17 wherein determining the controller delay value comprises:

determining a first delay value for a first memory device by iteratively increasing the first delay value from an initial delay value, the first delay value being a number of cycles delay until data is received by the memory controller from the selected memory device;

determining a next delay value for a next memory device starting at the first delay value; and selecting the greater of the first delay value and the next delay value as the controller delay value.

22. The system of claim 21 wherein the set of operations further comprises:

repeating determining the next delay value for another next memory device selected from the plurality of memory devices; and selecting a greater of the controller delay value and the next delay value as the controller delay value.

23. The system of claim 22 wherein the first memory device has a last serial identification value of the plurality of memory devices and where the method further comprises:

selecting the next memory device by selecting a memory device with a serial identification value prior to the selected memory device.

24. The system of claim 17 wherein determining the controller delay value comprises:

initializing a controller delay value to an initial delay value;

testing whether a transaction to a selected memory device succeeds;

if the transaction to the selected memory device fails then incrementing the controller delay value; and returning to testing whether the transaction to the selected memory device succeeds.

25. The system of claim 24 wherein the set of operations further comprises:

if the transaction to the memory device succeeds, then returning to testing whether the transaction to the selected memory device succeeds using the controller delay value for the transaction to the memory device which succeeded after selecting a new memory device from the plurality of memory devices as the selected memory device.

26. The system of claim 24 wherein the set of operations further comprises:

if the transaction to the memory device succeeds, then testing whether the controller delay value is a maximum controller delay value;

if the controller delay value is less than the maximum controller delay value then returning to testing whether the transaction to the selected memory device succeeds after selecting a new memory device as the selected memory device;

if the controller delay value is the maximum controller delay value then:
storing the maximum controller delay value as the controller delay value; and
stopping iterative testing to determine the controller delay value.

27. The system of claim 17 wherein determining the controller delay value further comprises:

if the controller delay value is less than a maximum controller delay value, then
selecting a new memory device as the selected memory device unless the controller delay value has been tested for all of the plurality of memory devices.

28. The system of claim 17 wherein the set of operations further comprises:

programming the memory device delay value for each of a plurality of enabled memory devices into a control field for the respective memory device to levelize delays from each of the plurality of memory devices to a controller.

29. The system of claim 28 wherein programming the plurality of memory device delay values in the plurality of memory devices further comprises:

testing whether a device delay value for a memory device is less than a maximum device delay value; and if the device delay value is greater than the maximum device delay value then disabling the memory device;

if the controller delay value is less than the maximum controller delay value, then selecting a new memory device as the selected memory device unless the controller delay value has been tested for all of the plurality of memory devices.

30. The system of claim 29 wherein disabling the memory device comprises disabling a serial identification value of the memory device.

31. An article comprising a machine readable medium having stored thereon a plurality of instructions which, if executed by the machine, cause the machine to perform a set of operations comprising:
   determining a controller delay value by iteratively testing memory transfers to determine a largest transfer latency value using a subset of a plurality of memory controller delays for at least one of a plurality of memory devices; and
   determining a memory device delay value for each of the plurality of memory devices by testing memory transfers using at least one delay value for each of the plurality of memory devices.

32. The article of claim 31 wherein the computer readable medium is a storage device.

33. The article of claim 31 wherein the computer readable medium is a carrier wave.

34. The article of claim 31 wherein the set of operations further comprises:
   storing the controller delay value in a controller storage location in a controller to set a channel delay that allows the controller to perform transactions with a slowest of the plurality of memory devices; and
   storing each memory device delay value in one or more delay storage locations of each of the plurality of memory devices to insert a delay levelizing a cycle count for data transactions between the controller and the plurality of memory devices.

35. The article of claim 31 wherein determining the memory device delay value further comprises:
   if less than a maximum number of device delay cycles causes the data transfer to succeed, then:
      determining a number of delay cycles that causes the data transfer to succeed; and
   if more than the maximum number of device delay cycles are required to cause the data transfer to succeed, then:
      stopping when the maximum number of device delay cycles is exceeded.

36. The article of claim 31 wherein determining the controller delay value comprises:
   determining a first delay value for a first memory device by iteratively increasing the first delay value from an initial delay value, the first delay value being a number of cycles delay until data is received by a controller from the selected memory device;
   determining a next delay value for a next memory device starting at the first delay value; and
   selecting the greater of the first delay value and the next delay value as the controller delay value.

37. The article of claim 36 wherein the set of operations further comprises:
   repeating determining the next delay value for another next memory device selected from the plurality of memory devices; and
   selecting a greater of the controller delay value and the next delay value as the controller delay value.

38. The article of claim 37 wherein the first memory device has a last serial identification value of the plurality of memory devices and wherein the set of operations further comprises:
   selecting the next memory device by selecting a memory device with a serial identification value prior to the selected memory device.

39. The article of claim 31 wherein determining the controller delay value comprises:
   initializing a controller delay value to an initial delay value;
   testing whether a transaction to a selected memory device succeeds;
   if the transaction to the selected memory device fails then incrementing the controller delay value; and
      returning to testing whether the transaction to the selected memory device succeeds.

40. The article of claim 39 wherein the set of operations further comprises:
   if the transaction to the memory device succeeds, then returning to testing whether the transaction to the selected memory device succeeds using the controller delay value for the transaction to the memory device which succeeded after selecting a new memory device from the plurality of memory devices as the selected memory device.

41. The article of claim 39 wherein the set of operations further comprises:
   if the transaction to the memory device succeeds, then
      testing whether the controller delay value is a maximum controller delay value;
      if the controller delay value is less than the maximum controller delay value then returning to testing whether the transaction to the selected memory device succeeds after selecting a new memory device as the selected memory device;
      if the controller delay value is the maximum controller delay value then:
         storing the maximum controller delay value as the controller delay value; and
         stopping iterative testing to determine the controller delay value.

42. The article of claim 31 wherein determining the controller delay value further comprises:
   if the controller delay value is less than a maximum controller delay value, then
      selecting a new memory device as the selected memory device unless the controller delay value has been tested for all of the plurality of memory devices.

43. The article of claim 31 wherein the set of operations further comprises:
   programming the memory device delay value for each of a plurality of enabled memory devices into a control field for the respective memory device to levelize delays from each of the plurality of memory devices to a controller.

44. The article of claim 43 wherein programming the plurality of memory device delay values in the plurality of memory devices further comprises:
   testing whether a device delay value for a memory device is less than a maximum device delay value; and
   if the device delay value is greater than the maximum device delay value then disabling the memory device;
   if the controller delay value is less than the maximum controller delay value, then selecting a new memory device as the selected memory device unless the controller delay value has been tested for all of the plurality of memory devices.

45. The article of claim 44 wherein disabling the memory device comprises disabling a serial identification value of the memory device.

46. An article comprising a machine readable medium storing instructions that, if executed by a machine, cause the machine to perform a set of operations comprising:

determining a first delay value for a first memory device by iteratively increasing the first delay value from an initial delay value, the first delay value being a number of cycles delay until data is received by a controller from the selected memory device;

determining a next delay value for a next memory device starting at the first delay value;

selecting the greater of the first delay value and the next delay value as the controller delay value;

testing whether the controller delay value is a maximum controller delay value; and if the controller delay value is the maximum controller delay value then:

storing the maximum controller delay value as the controller delay value in a register of the controller; and stopping iterative testing to determine the controller delay value.

47. The article of claim 46 wherein the set of operations further comprises:

if the controller delay value is less than the maximum controller delay value then returning to testing whether the transaction to the selected memory device succeeds after selecting a new memory device as the selected memory device.

48. An article comprising a machine readable medium storing instructions that, if executed by a machine, cause the machine to perform a set of operations comprising:

determining an individual memory delay value for each of a plurality of memory devices, the individual memory delay value being a number of delays up to a maximum delay value which levelizes a read delay for the plurality of memory devices; and testing whether a device delay value for a memory device is less than a maximum device delay value;

if the device delay value is greater than the maximum device delay value then disabling the memory device by assigning an unused device identification number;

if the device delay value is less than the maximum device delay value then testing whether another device delay value for another memory device is less than the maximum device delay value.

49. A system comprising:

a processor;

a memory controller coupled to the processor;

a plurality of memory devices coupled to the memory controller; and a separate memory device having stored thereon a plurality of instructions which, if executed by the system, cause the system to perform a set of operations comprising:

determining a first delay value for a first memory device by iteratively increasing the first delay value from an initial delay value, the first delay value being a number of cycles delay until data is received by a controller from the selected memory device;

determining a next delay value for a next memory device starting at the first delay value;

selecting the greater of the first delay value and the next delay value as the controller delay value;

testing whether the controller delay value is a maximum controller delay value; and if the controller delay value is the maximum controller delay value then:

storing the maximum controller delay value as the controller delay value in a register of the memory controller; and stopping iterative testing to determine the controller delay value.

50. The system of claim 49 wherein the set of operations further comprises:

if the controller delay value is less than the maximum controller delay value then returning to testing whether the transaction to the selected memory device succeeds after selecting a new memory device as the selected memory device.

51. A system comprising:

a processor;

a memory controller coupled to the processor;

a plurality of memory devices coupled to the memory controller; and a separate memory device having stored thereon a plurality of instructions which, if executed by the system, cause the system to perform a set of operations comprising:

determining an individual memory delay value for each of a plurality of memory devices, the individual memory delay value being a number of delays up to a maximum delay value which levelizes a read delay for the plurality of memory devices; and testing whether a device delay value for a memory device is less than a maximum device delay value;

if the device delay value is greater than the maximum device delay value then disabling the memory device by assigning an unused device identification number;

if the device delay value is less than the maximum device delay value then testing whether another device delay value for another memory device is less than the maximum device delay value.

* * * * *